US006795166B2

(12) United States Patent
Kato et al.

(10) Patent No.: US 6,795,166 B2
(45) Date of Patent: Sep. 21, 2004

(54) ILLUMINATOR, EXPOSURE APPARATUS, AND METHOD FOR FABRICATING DEVICE USING THE SAME

(75) Inventors: Hideo Kato, Utsunomiya (JP); Hiroshi Maehara, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/159,775

(22) Filed: Sep. 24, 1998

(65) Prior Publication Data

US 2001/0043320 A1 Nov. 22, 2001

(30) Foreign Application Priority Data

Sep. 30, 1997 (JP) .............................. 9-282995

(51) Int. Cl.$^7$ .................. G03B 27/54; G03B 27/42; G03B 27/52; G03F 9/00; A61N 5/00
(52) U.S. Cl. .................... 355/67; 355/53; 355/30; 355/55; 430/5; 250/492.2; 250/492.22
(58) Field of Search ................ 355/67, 53, 30, 355/55; 430/5; 250/492.2, 492.22

(56) References Cited

U.S. PATENT DOCUMENTS

| 4,358,198 | A | * | 11/1982 | Moriyama et al. |
| 4,991,937 | A | * | 2/1991 | Urino ..................... 350/401 |
| 5,028,967 | A | * | 7/1991 | Yamada et al. |
| 5,140,464 | A | * | 8/1992 | Kyogoku et al. ........... 359/588 |
| 5,349,604 | A | * | 9/1994 | Nakata |
| 5,430,303 | A | | 7/1995 | Matsumoto et al. ..... 250/492.2 |
| 5,661,546 | A | * | 8/1997 | Taniguchi ................ 355/53 |
| 5,668,672 | A | * | 9/1997 | Oomura |
| 5,691,541 | A | * | 11/1997 | Ceglio et al. ............ 250/492.1 |
| 5,751,474 | A | * | 5/1998 | Hohenegger et al. ....... 359/360 |
| 5,786,114 | A | * | 7/1998 | Hashimoto ................ 430/5 |
| 5,885,735 | A | * | 3/1999 | Imai et al. ................ 430/5 |
| 5,966,613 | A | * | 10/1999 | Zhal et al. ................ 438/401 |
| 6,372,646 | B2 | * | 4/2002 | Ohmi et al. |

FOREIGN PATENT DOCUMENTS

| JP | 6-45229 | 2/1994 |
| JP | 9-72761 | 3/1997 |
| JP | 9-225295 | 9/1997 |
| JP | 10-112429 | 4/1998 |
| JP | 10-125583 | 5/1998 |

* cited by examiner

Primary Examiner—Frank G. Font
Assistant Examiner—Khaled Brown
(74) Attorney, Agent, or Firm—Fitzpatrick, Cella, Harper & Scinto

(57) ABSTRACT

In a projection aligner for illuminating a pattern on a mask with a luminous flux from a light source through an illumination system and projecting the pattern onto a wafer with a projection optical system, a titanium oxide ($TiO_2$) film is provided on the surface of at least one optical unit in the projection aligner. Thus, contamination of the projection aligner can be reduced.

10 Claims, 4 Drawing Sheets

ILLUMINATOR, EXPOSURE APPARATUS, AND METHOD FOR FABRICATING DEVICE USING THE SAME

BACKGROUND OF THE INVENTION

1. Field of the Invention

The present invention relates to an illumination apparatus (illuminator), an exposure apparatus, and a method for fabricating devices using the same. In particular, the present invention is suitable for fabricating devices, for example, semiconductor devices such as ICs and LSIs, liquid crystal devices, image devices such as CCDs, and magnetic heads. A titanium oxide ($TiO_2$) film is provided on a portion of an optical unit included in an exposure apparatus such as a projection exposure apparatus (projection aligner) or on a portion of a supporting unit for supporting the optical unit, in order to prevent dust, hazardous substances in the air, and the like from adhering to and contaminating the surface of each unit, even when far ultraviolet light is used as exposure light for long periods of time.

2. Description of the Related Art

With respect to high integration photolithography in fabricating semiconductor devices, there has been a shift in the exposure light used from visible region light to ultraviolet region light. In recent applications of photolithography, a laser such as an excimer laser is used as a light source instead of a mercury lamp. Also, in recent applications of lithography, there has been a shift in the environment in which projection and exposure are performed, from in the air to in a non-oxygen atmosphere, such as a nitrogen, reduced-pressure, or vacuum atmosphere. Chemically amplified resists using acid catalysts are becoming popular. Also, there have been considerable changes in specifications required for optical materials (i.e., optical units) such as optical elements, for example, lenses and mirrors, included in optical systems used for reduction-type projection aligners such as steppers, fabrication apparatuses, and processes.

Chemical contamination in a clean room in which photolithography is performed may be caused by the breakdown of substances by photoreaction of a resist, the scattering of substances during coating, development, baking, cleaning, and other processes, and the vaporization of substances from adhesives and wall materials. These substances float in the air with a considerable density. Because of the substances described above, surfaces of optical elements such as lenses, mirrors, and prisms are considerably contaminated after they are exposed for a long time by KrF or ArF excimer laser light, or deep ultraviolet light. Substance adhering to the surfaces significantly decrease optical properties such as transmittance and reflectance. Generally, these substances vary in shape and composition, and although adhesion is more likely to occur in certain environments, the reasons for adhesion are not clear. It may be inferred from the above that decomposition, recombination, multiple reactions, deposition, crystallization, and the like, act complexly instead of a simple photochemical reaction.

Contamination of optical units is a serious problem, particularly with steppers, which are used for fabrication of semiconductor devices. Contamination also is a serious problem with optical systems for other usages such as lens systems for still cameras, lens systems for video cameras, lens systems for telescopes, and lenses, mirrors, prisms, and diffraction gratings for microscopes and measuring instruments.

SUMMARY OF THE INVENTION

It is an object of the present invention to provide an illuminator, an exposure apparatus, and a method for fabricating devices using the same, in which optical properties do not decrease.

In accordance with an illuminator of the present invention, in one aspect, an illuminator for illuminating a surface to be illuminated with a luminous flux from a light source through an illumination system includes a titanium oxide film provided on the surface of at least one unit which constitutes the illumination system;

In another aspect, an illuminator for illuminating a surface to be illuminated with a luminous flux from a light source through an illumination system includes a titanium oxide film provided on the surface of at least one region of at least one optical unit among a plurality of optical units placed in an optical path from the light source to the surface to be illuminated; and In still another aspect, an illuminator for illuminating a surface to be illuminated with a luminous flux from a light source through an illumination system includes a titanium oxide film provided on the surface of at least one region of at least one supporting unit among a plurality of supporting units for supporting at least one optical unit among a plurality of optical units placed in an optical path from the light source to the surface to be illuminated.

Preferably, in an illuminator of the present invention according to the above aspects, the luminous flux is ultraviolet light, and the titanium oxide film prevents contaminants, for example, dust and hazardous substances in the air, from adhering to and contaminating the unit provided with the titanium oxide film or its adjacent unit by a photoconductive function such as photoconduction and a photocatalytic reaction caused by the absorption of the ultraviolet light.

The unit or the optical unit includes at least one of a diaphragm, a shutter, and a lens barrel.

The unit or the optical unit includes at least one of a lens, a mirror, a prism, a filter, a diffuser, a diffraction optical element, and an optical integrator.

The unit or the optical unit includes a diffraction optical lens using a diffraction optical element, or a mirror.

The titanium oxide film is provided on the surface of a portion of a region of the optical unit in which light passes through.

The titanium oxide film has a thickness ranging from 10 nm to 100 nm.

In accordance with an exposure apparatus of the present invention, in one aspect, an exposure apparatus for illuminating a pattern on a mask with a luminous flux from a light source through an illumination system and exposing a substrate with the pattern includes a titanium oxide film provided on the surface of at least one unit among a plurality of units which constitute the exposure apparatus;

In another aspect, an exposure apparatus for illuminating a pattern on a mask with a luminous flux from a light source through an illumination system and exposing a substrate with the pattern includes a titanium oxide film provided on the surface of at least one region of at least one optical unit among a plurality of optical units placed in an optical path from the light source to the substrate; and In still another aspect, an exposure apparatus for illuminating a pattern on a mask with a luminous flux from a light source through an illumination system and exposing a substrate with the pattern includes a titanium oxide film provided on the surface of at least one region of at least one supporting unit among a plurality of supporting units for supporting at least one optical unit among a plurality of optical units placed in an optical path from the light source to the substrate.

Preferably, in an exposure apparatus of the present invention according to the above aspects, the luminous flux is ultraviolet light, and the titanium oxide film prevents contaminants, for example, dust and hazardous substances in the air, from adhering to and contaminating the unit provided with the titanium oxide film or its adjacent unit by a photoconductive function such as photoconduction and a photocatalytic reaction caused by the absorption of the ultraviolet light.

The unit includes at least one of a diaphragm, a shutter, and a lens barrel.

The unit or the optical unit includes at least one of a lens, a mirror, a prism, a filter, a diffuser, a diffraction optical element, and an optical integrator.

The unit or the optical unit includes a diffraction optical lens using a diffraction optical element, or a mirror.

The titanium oxide film is provided on the surface of a portion of a region of the optical unit in which light passes through.

Exposure is performed while the pattern on the mask and the substrate are synchronously scanned.

The titanium oxide film has a thickness ranging from 10 nm to 100 nm.

In accordance with a method for fabricating devices of the present invention, a method includes the steps of exposing a wafer with a device pattern formed on a reticle using an exposure apparatus according to any one of the above aspects, and developing the wafer.

In accordance with a projection aligner of the present invention, in one aspect, a projection aligner for illuminating a pattern on a mask with a luminous flux from a light source through an illumination system and projecting the pattern onto a wafer by a projection optical system includes a titanium oxide film provided on the surface of at least one unit which constitutes the projection aligner;

In another aspect, a projection aligner for illuminating a pattern on a mask with a luminous flux from a light source through an illumination system and projecting the pattern onto a wafer by a projection optical system includes a titanium oxide film provided on the surface of at least one region of at least one optical unit among a plurality of optical units placed in an optical path from the light source to the wafer; and In still another aspect, a projection aligner for illuminating a pattern on a mask with a luminous flux from a light source through an illumination system and projecting the pattern onto a wafer by a projection optical system includes a titanium oxide film provided on the surface of at least one region of at least one supporting unit among a plurality of supporting units for supporting one or a plurality of optical units placed in an optical path from the light source to the wafer.

Preferably, in a projection aligner of the present invention according to the above aspects,
the luminous flux is ultraviolet light, and the titanium oxide film prevents contaminants, for example, dust and hazardous substances in the air, from adhering to and contaminating a surface of the unit provided with the titanium oxide film through a photoconductive function such as photoconduction and a photocatalytic reaction caused by the absorption of the ultraviolet light.

The unit includes at least one of a diaphragm, a shutter, and a lens barrel.

The unit includes at least one of a lens, a mirror, a prism, a filter, a diffuser, a diffraction optical element, and an optical integrator.

The unit includes a diffraction optical lens using a diffraction optical element, or a mirror.

The titanium oxide film is provided in a portion of a region through which light passes on the surface of the optical unit.

Projection and exposure are performed while the pattern on the mask and the wafer are synchronously scanned at a velocity ratio in response to imaging magnification of the projection optical system.

The titanium oxide film has a thickness ranging from 10 nm to 100 nm.

In accordance with a method for fabricating devices of the present invention, a method includes the steps of projecting a device pattern formed on a reticle onto a wafer after the reticle is aligned with the wafer using a projection aligner according to any one of the above aspects, and developing the wafer.

Further objects, features and advantages of the present invention will become apparent from the following description of the preferred embodiments with reference to the attached drawings.

DESCRIPTION OF THE PREFERRED EMBODIMENTS

Figure 1:
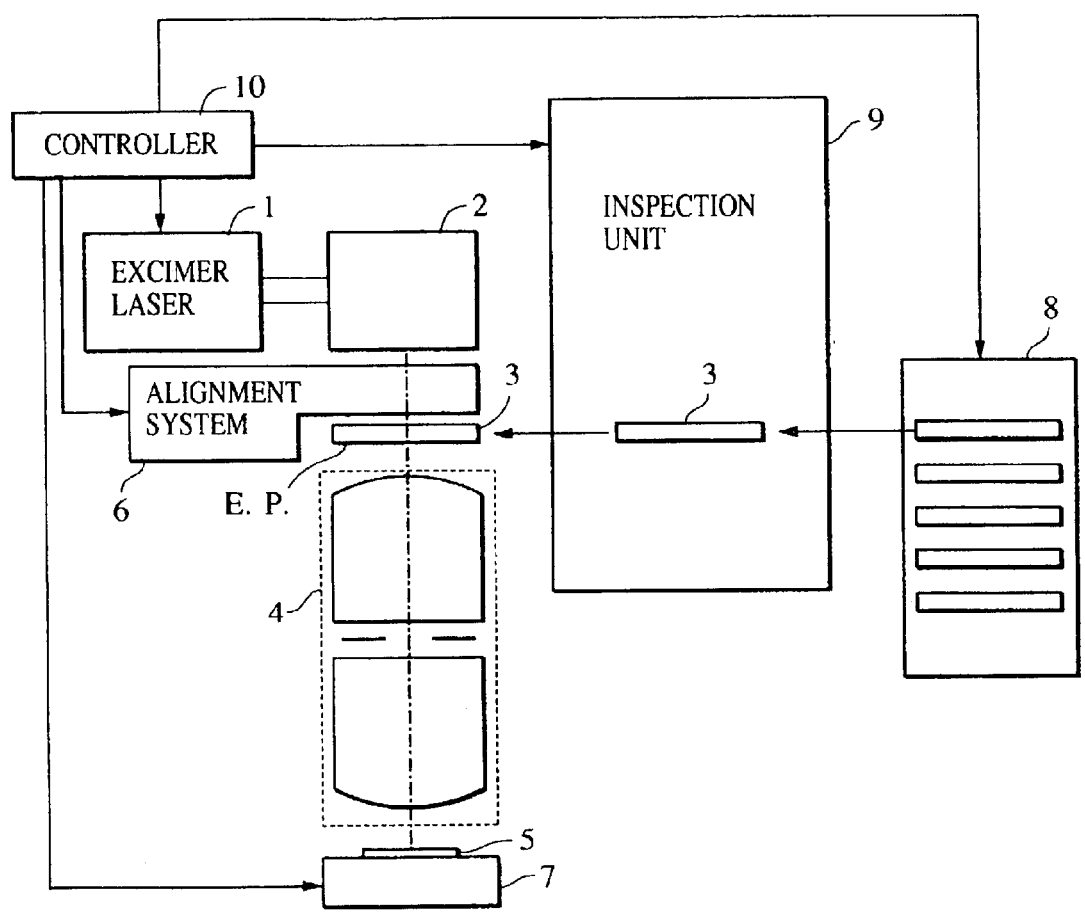
FIG. 1 is a schematic diagram of the key portion of a system for fabricating semiconductor devices using an exposure apparatus in accordance with the present invention.

FIG. 1 is a schematic diagram of the key portion of a projection aligner and a system for fabricating devices using the same in accordance with a first embodiment of the present invention.

In accordance with this embodiment, a circuit pattern formed on a reticle, a photomask, or the like (generically called a "mask") is printed onto a wafer (i.e., photosensitive substrate) to fabricate a semiconductor device. The system includes a projection aligner, a container for masks, an inspection unit for original masks, and a controller, which are all placed in a clean room.

In FIG. 1, numeral 1 represents an excimer laser containing KrF, ArF, or the like, as a light source, for radiating ultraviolet light or far ultraviolet light. A high-pressure mercury-vapor lamp (i-line light) may be used instead of an excimer laser. Numeral 2 represents an illumination system for illuminating a reticle 3 set at an exposure position E.P. from above with a given numerical aperture (NA). Numeral 4 represents a projection optical system (projection lens) for reduction projecting and printing a circuit pattern formed on the reticle 3 onto a wafer 5 such as a silicon substrate. Numeral 6 represents an alignment system for aligning the reticle 3 with the wafer 5 prior to an exposure operation. The alignment system 6 is provided with a microscope system for observing reticles. Numeral 7 represents a wafer stage. The units 1 through 6 described above constitute the projection aligner.

Numeral 8 represents a container for containing a plurality of reticles as masks. Numeral 9 represents an inspection unit for detecting foreign particles on reticles. The inspection unit 9 inspects for foreign particles on a reticle before the selected reticle from the container 8 is set at the exposure position E.P.

A controller 10 controls the sequence of the entire system, including commands for operating the container 8 and the inspection unit 9, and sequences such as alignment, exposure, and step-feed of wafers, which are the basic operations of a projection aligner.

In accordance with this embodiment, a step-and-repeat projection aligner or a step-and-scan projection aligner is used. With respect to the step-and-scan projection aligner, projection and exposure are performed while the reticle 3 and the wafer 5 are scanned synchronously at a velocity ratio based on imaging magnification of the projection optical system 4.

Also, in accordance with this embodiment, a proximity aligner, in which exposure is performed without a projection lens, may be used in the same manner, instead of a projection aligner.

In accordance with this embodiment, the illumination system 2, the projection optical system 4, the inspection unit 9 and the alignment system 6 employ various optical units (optical elements) such as lenses, mirrors, prisms, diffraction optical elements (binary optics elements, i.e., BO elements).

A titanium oxide ($TiO_2$) film is provided on the surface of one or all of these optical units and at least on a portion of the surface of at least one supporting unit (lens barrel) for supporting one or all of the optical units. This effectively prevents dust, hazardous substances in the air, and the like from adhering to and contaminating the surface of each unit even when the fabrication of semiconductor devices is performed for a long period of time.

The $TiO_2$ film used in this embodiment functions as a photo semiconductor by absorbing ultraviolet light, in particular, far ultraviolet light. The typical functions of a photo semiconductor include, the antistat effect by photoconduction, the decomposition reaction as a photocatalyst, the reduction in the angle of contact toward water, and the antibacterial reaction. Since $TiO_2$ has a high refractive index and absorbency in the ultraviolet region, the $TiO_2$ film must be thin when provided on the surface of an optical unit.

When $TiO_2$ is evaporated onto the surface of an optical unit, the thickness of the $TiO_2$ film will be approximately 100 nm at most. When the $TiO_2$ film is irradiated with a powerful beam such as a laser beam, it functions as a photo semiconductor sufficiently, even at a thickness of approximately 10 nm. Therefore, in accordance with the present invention, the thickness of the $TiO_2$ film is set between 10 nm to 100 nm. When there is a decrease in optical properties such as transmittance, the $TiO_2$ film is provided partially only on the periphery of optical elements (units).

In accordance with the present embodiment, in order to deposit a $TiO_2$ film onto the surface of each unit, a vapor deposition process may be used, or the film may be formed by hydrolysis by heating the surface after it is preliminarily coated with alkyltitanate.

Next, typical examples in which $TiO_2$ is applied on the surfaces of optical units or supporting units constituting the individual apparatuses will be described one by one.

EXAMPLE 1

A $TiO_2$ film having a thickness of 10 nm was evaporated by a resistance heating evaporation system onto the surface of a portion of lenses in a projection optical system composed of quartz for a KrF stepper (a step-and-repeat or step-and-scan reduction-type projection aligner). The portion of lenses corresponded to one lens out of approximately 20 lenses constituting the entire projection optical system.

In a conventional apparatus, which does not use a $TiO_2$ film, adhesion was observed on the surface of each lens in the projection optical system after being used for approximately 6 months. In accordance with the present embodiment, only one of the lenses constituting the projection optical system was applied with $TiO_2$ treatment.

When the surface of the lens was inspected after steady operation for 6 months, significantly little adhesion was observed on the surface of this lens, which was within the allowable level for a projection system for fabricating devices. Also, the surfaces of lenses lying on both sides of the lens had significantly little adhesion. This shows that the $TiO_2$ film is effective at improving the surrounding atmosphere.

Figure 2:
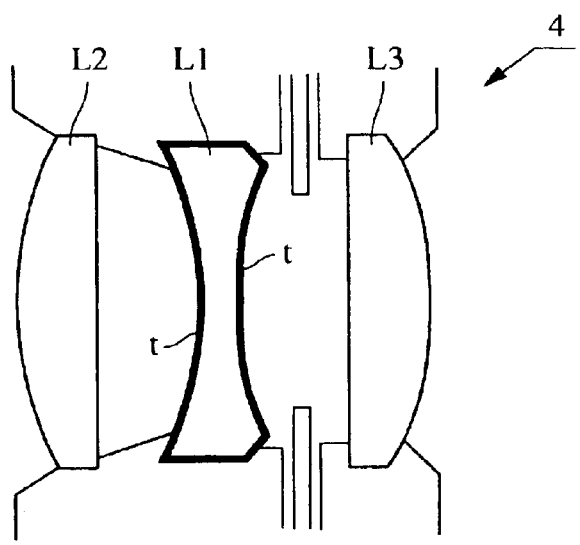
FIG. 2 is a schematic diagram of a first example in which a $TiO_2$ film is provided on the surface of a unit constituting an exposure apparatus in accordance with the present invention.

FIG. 2 is a schematic diagram of a portion of a plurality of lenses constituting a projection optical system 4 for a stepper. In this drawing, symbol L1 represents a lens that is applied with a $TiO_2$ film t. Symbols L2 and L3 represent lenses that are not treated with $TiO_2$.

EXAMPLE 2

A $TiO_2$ film having a thickness of 20 nm was evaporated by a sputtering system onto the surface of the peripheral area of a portion of lenses constituting a projection optical system composed of fluorite for a KrF stepper (a step-and-repeat or step-and-scan reduction-type projection aligner). The portion of lenses corresponded to one lens out of the total of approximately 20 lenses.

In a conventional apparatus, which does not use a $TiO_2$ film, adhesion was observed on the surface of each lens in the projection optical system after being used for approximately 6 months. In accordance with the present embodiment, only one of the lenses constituting the projection optical system was treated with $TiO_2$.

Even after being used for several months, the surface of the lens had significantly little adhesion, which was within the allowable level as a projection system for fabricating devices. Also, the surfaces of lenses lying on both sides (i.e., in front and rear) of the lens had significantly little adhesion. This shows that the $TiO_2$ film is effective at improving the surrounding atmosphere.

Figure 3:
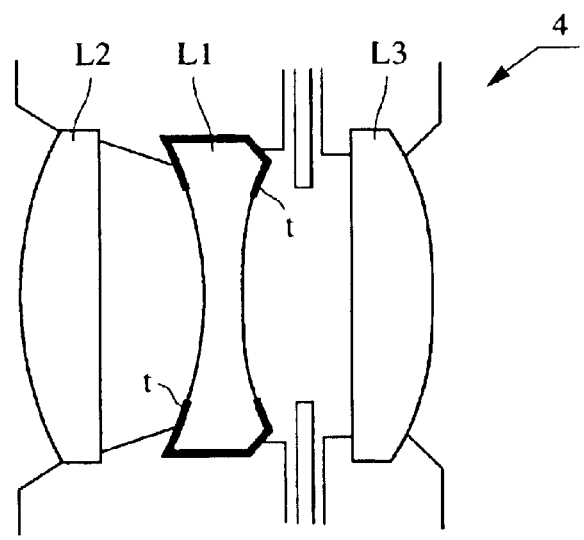
FIG. 3 is a schematic diagram of a second example in which a $TiO_2$ film is provided on the surface of a unit constituting an exposure apparatus in accordance with the present invention.

FIG. 3 is a schematic diagram of a portion of a plurality of lenses constituting a projection optical system 4. In this drawing, a TiO$_2$ film t is provided on the periphery of a central lens L1. Symbols L2 and L3 represent lenses that are not treated with TiO$_2$.

EXAMPLE 3

A TiO$_2$ film having a thickness of 20 nm was formed by a dipping process onto the surface of a reflecting mirror among the optical units used for an illumination system of a stepper. In more detail, after a solution of alkyltitanate in butanol was applied onto both surfaces of the reflecting mirror by using a growth method, heat treatment was performed at approximately 350° C. to form the film by hydrolysis.

As a result of an inspection of the surface of the reflecting mirror after being used for 6 months, significantly less contamination (adhesion) was observed in comparison with the conventional apparatus, and thus the effectiveness of the TiO$_2$ film was confirmed. Also, the formation of the TiO$_2$ film onto the periphery of the mirror, off the optical axis, exhibited the same effect. This shows that the TiO$_2$ film is effective at improving the surrounding atmosphere.

EXAMPLE 4

A TiO$_2$ film was formed by performing surface treatment onto the supporting units in the lens barrel supporting the individual units of the optical system in a stepper, a shade plate, a diaphragm, a shutter, and the like by using processes such as a vapor deposition process and a dipping process described in Examples 1 through 3.

As a result of a contamination inspection of the surfaces after 6 months of operation, a significantly small loss of transmittance, resulting from contamination on the surfaces of the lenses and optical elements provided with the TiO$_2$ film, was observed, in comparison with the conventional case in which no TiO$_2$ film was used.

Figure 4:
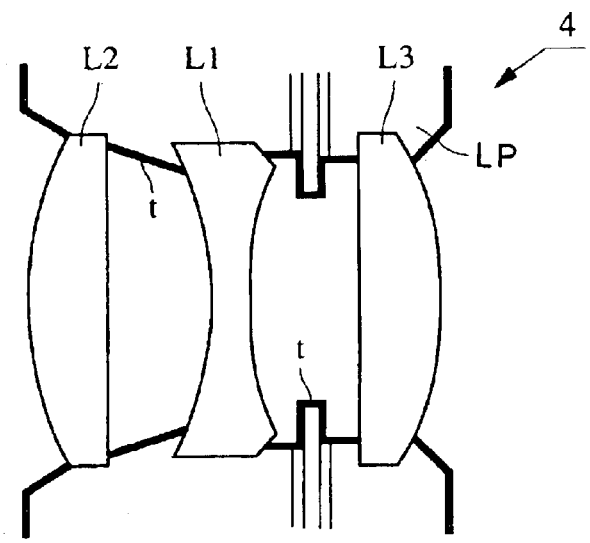
FIG. 4 is a schematic diagram of a fourth example in which a $TiO_2$ film is provided on the surface of a unit constituting an exposure apparatus in accordance with the present invention.

FIG. 4 is a schematic diagram showing an example in which a TiO$_2$ film t is provided on a portion of a holding frame LP for holding lenses L1, L2, and L3 among a portion of lenses constituting a projection optical system 4. The reflected light (ultraviolet light) from a lens surface enters into the TiO$_2$ film t, and TiO$_2$ functions as a photo semiconductor by absorbing ultraviolet light.

With respect to a unit that does not transmit light as described above, the TiO$_2$ film absorbs ultraviolet light from scattered light or the like and functions as a photo semiconductor.

EXAMPLE 5

A TiO$_2$ film was formed onto the surfaces of a prism, a binary optical element, a diffraction grating, a polarizer, a diffuser, fly's eye lenses, and the like, by using processes such as a vapor deposition process and a dipping process in accordance with Examples 1 through 3. When far ultraviolet rays generated from an excimer laser or the like were used, significantly low contamination was observed in comparison with conventional cases.

EXAMPLE 6

A semiconductor device was fabricated by using ArF excimer and KrF excimer steppers including optical lenses, optical elements, and lens barrels provided with the TiO$_2$ film formed by processes in accordance with Examples 1 through 5. As a result of an inspection after the device had been used in a predetermined wafer process for 6 months, a small loss of transmittance and little contamination, which were within the allowable levels, were observed.

EXAMPLE 7

A TiO$_2$ film having a thickness of 10 nm was evaporated by a resistance heating evaporation system onto the surface of a binary optics lens (BO lens), i.e., a diffraction optical element, among the lenses constituting a projection optical system composed of quartz for a KrF stepper (a step-and-repeat or step-and-scan reduction-type projection aligner). The BO lens was one of approximately 20 lenses constituting the projection optical system.

In a conventional apparatus that does not use a TiO$_2$ film, adhesion was observed on the surface of each lens in the projection optical system after being used for approximately 6 months. In accordance with the present embodiment, only one BO lens among the lenses constituting the projection optical system was treated with TiO$_2$.

When the surface of the BO lens was inspected after steady operation for 6 months, significantly little adhesion was observed on the surface of the BO lens treated with TiO$_2$, which was within the allowable level for a projection optical system for fabricating devices. Also, the surfaces of the lenses lying on both sides of the BO lens had significantly little adhesion. This shows that the TiO$_2$ film is effective at improving the surrounding atmosphere.

Figure 5:
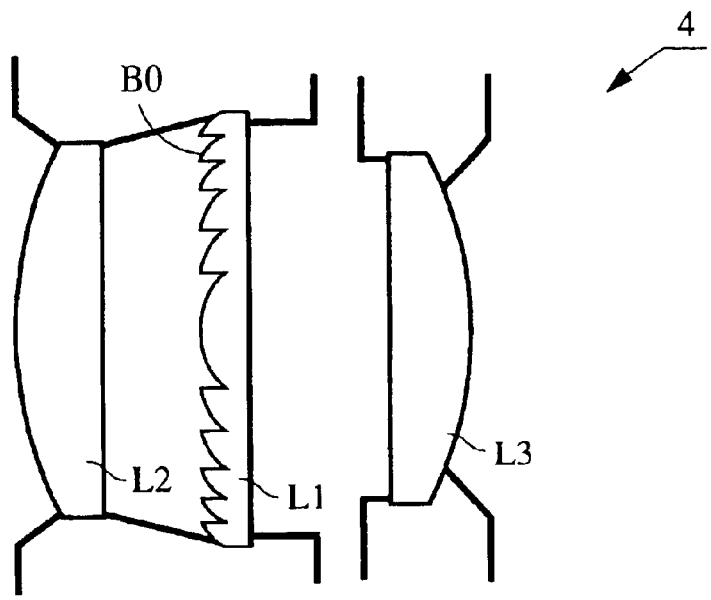
FIG. 5 is a schematic diagram of a seventh example in which a $TiO_2$ film is provided on the surface of a unit constituting an exposure apparatus in accordance with the present invention.

FIG. 5 is a schematic diagram of a portion of a plurality of lenses constituting a projection optical system 4 for a stepper. In this drawing, symbol L1 represents a BO lens that is applied with a TiO$_2$ film t. Symbols L2 and L3 represent lenses that are not treated with a TiO$_2$ film. Symbol BO represents a binary surface.

EXAMPLE 8

A TiO$_2$ film having a thickness of 20 nm was evaporated by a sputtering system onto the surface of a BO lens among units constituting a projection optical system composed of fluorite for an ArF stepper (a reduction-type projection aligner). The BO lens treated with TiO$_2$ was one out of the total of approximately 20 lenses constituting the optical unit.

Figure 6:
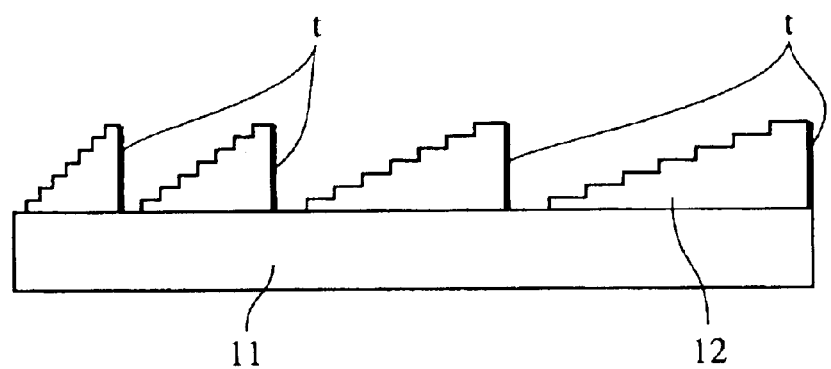
FIG. 6 is a schematic diagram of an eighth example in which a $TiO_2$ film is provided on the surface of a binary optics lens constituting an exposure apparatus in accordance with the present invention.

FIG. 6 is a schematic diagram of a diffraction optical element unit provided on the surface of the BO lens. After a TiO$_2$ film was deposited onto the walls in a slanting direction, the TiO$_2$ film on the front surface was removed by dry etching from above to form TiO$_2$ films only on the walls. In such a case, light loss was smaller, resulting in high performance, in comparison with a case in which a TiO$_2$ film was provided on the entire surface.

In a conventional apparatus, adhesion was observed on the lens surface after being operated for approximately 6 months. On the contrary, significantly little adhesion, which was within the allowable level, was observed on the surface of the BO lens treated with TiO$_2$. Also, the surfaces of the lenses lying on both sides of the BO lens had significantly little adhesion. This shows that the TiO$_2$ film is effective at improving the surrounding atmosphere.

In the drawing, numeral 11 represents a BO substrate, numeral 12 represents a binary diffraction optical element having 8 steps, and symbol t represents a TiO$_2$ film.

EXAMPLE 9

A TiO$_2$ film having a thickness of 10 nm was formed by a dipping process onto the surface of a BO element among the optical units used for an illumination system of a stepper.

In more detail, after a solution of alkyltitanate in butanol was applied onto both surfaces of the BO element by using a growth method, heat treatment was performed at approximately 350° C. to form the film by hydrolysis. Further, a $TiO_2$ film was formed onto the step surface of the BO element by dry-etching from above. A $TiO_2$ film was formed also on the back surface at the same time.

As a result of an inspection of the surface of the BO element after 6 months of operation, significantly less contamination (adhesion) was observed in comparison with the conventional apparatus, and thus the effectiveness of the $TiO_2$ film was confirmed.

Figure 7:
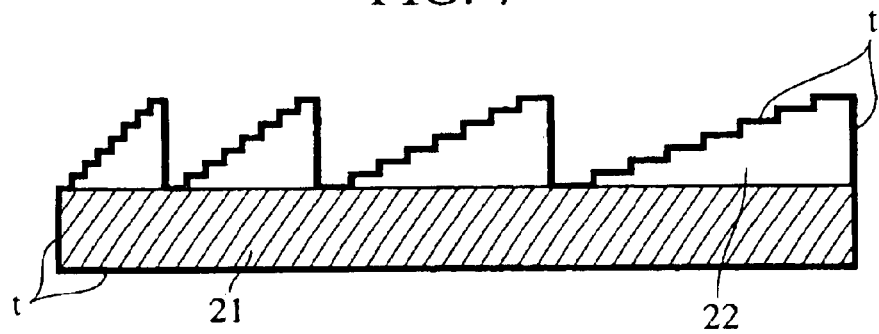
FIG. 7 is a schematic diagram of a ninth example in which a $TiO_2$ film is provided on the surface of a binary optics lens constituting an exposure apparatus in accordance with the present invention.

FIG. 7 is a schematic diagram of the key portion of a BO element in this example. Numeral 21 represents a mirror substrate, numeral 22 represents a binary diffraction optical element, and symbol t represents a $TiO_2$ film.

EXAMPLE 10

A $TiO_2$ film was provided on a portion of individual units of an optical system of a stepper by using processes such as a vapor deposition process and a dipping process described in Examples 7 through 9, and also a $TiO_2$ film was formed by performing surface treatment onto the supporting units in the lens barrel supporting the optical units, a shade plate, a diaphragm, and the like.

As a result of a contamination inspection of the surfaces after 6 months of operation, a significantly small loss of transmittance resulting from contamination on the surfaces of the lenses and optical elements was observed, in comparison with the conventional case in which no $TiO_2$ film is used.

Next, a method for fabricating devices, which uses a system in accordance with the present invention, will be described.

Figure 8:
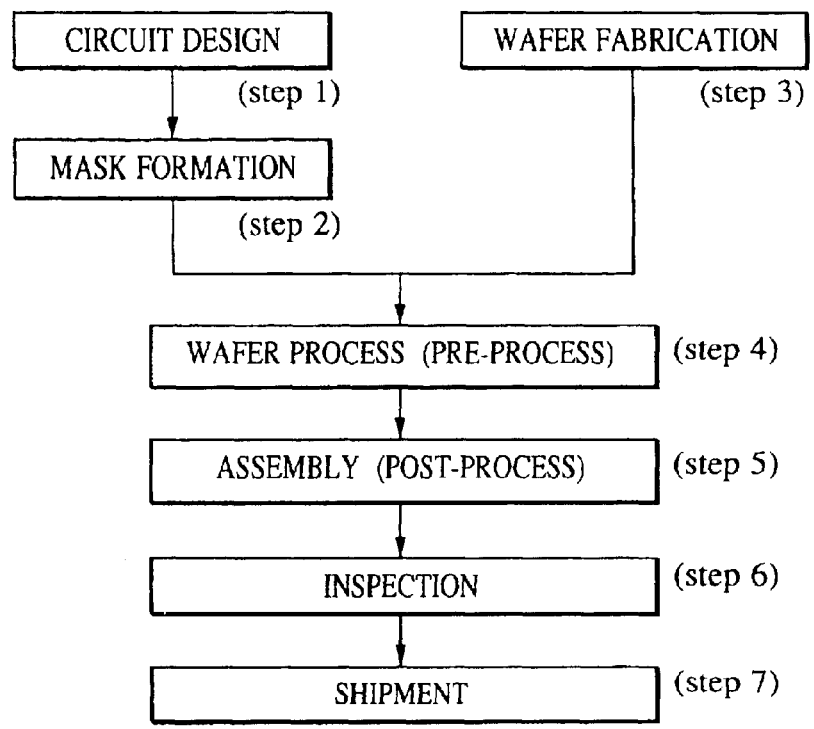
FIG. 8 is a flow chart which shows a method for fabricating devices in accordance with the present invention.

FIG. 8 is a flow chart of the processes for fabricating devices such as chips, for example, ICs and LSIs, liquid crystal panels, or CCDs.

In step 1 (circuit design), a circuit for a device is designed. In step 2 (mask formation), a mask provided with the designed circuit pattern is formed.

Meanwhile, in step 3 (wafer fabrication), wafers are fabricated using silicon or the like.

Step 4 (wafer process) is referred to as a pre-process, in which an actual circuit is formed on the wafer by lithography, using the mask (reticle) 3, the wafer 5, and a projection lens in accordance with the present invention. Step 5 (assembly) is referred to as a post-process, in which the wafer formed in step 4 is processed to form chips, and includes an assembly process (e.g., dicing and bonding), a packaging process (e.g., chip encapsulation), and so on.

In step 6 (inspection), the device fabricated in step 5 is inspected, including, for example, a performance test and an endurance test. In step 7 (shipment), the device is shipped after undergoing the processes described above.

Figure 9:
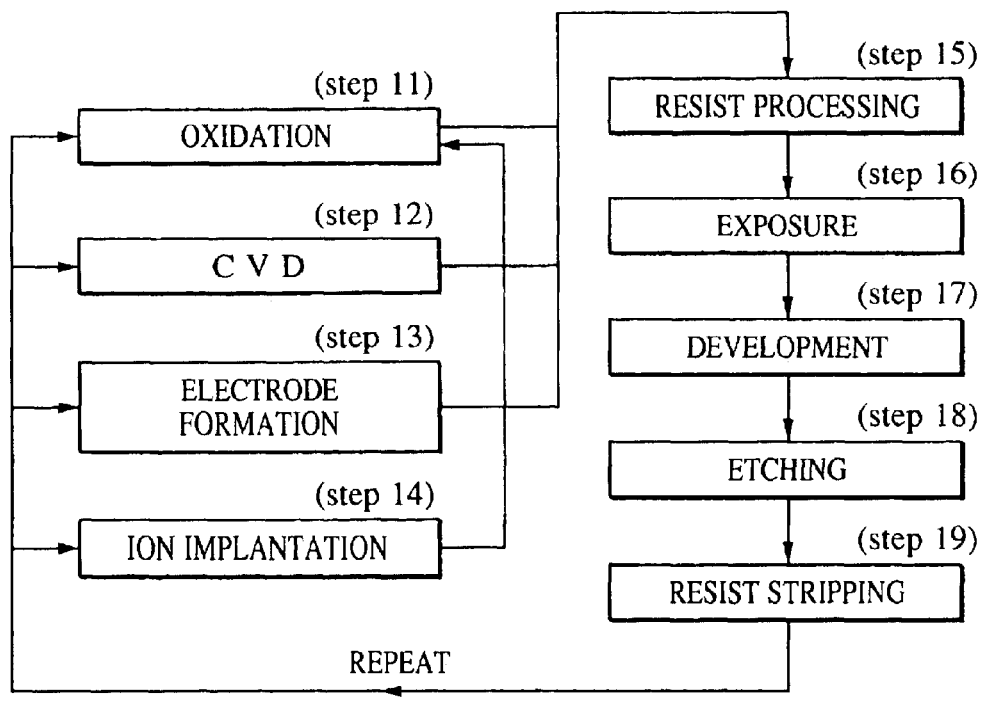
FIG. 9 is a detailed flow chart of a wafer process.

FIG. 9 is a detailed flow chart of the above-mentioned wafer process (step 4).

In step 11 (oxidation), the surface of the wafer is oxidized. In step 12 (CVD), an insulation film is formed on the surface of the wafer.

In step 13 (electrode formation), electrodes are formed on the wafer by evaporation. In step 14 (ion implantation), ions are implanted into the wafer. In step 15 (resist processing), a photosensitive material is applied onto the wafer. In step 16 (exposure), the circuit pattern on the reticle is projected and exposed onto the wafer, using a projection lens in accordance with the present invention.

In step 17 (development), the exposed wafer is developed. In step 18 (etching), an area excluding the developed resist is etched. In step 19 (resist stripping), any unnecessary resist remaining after etching is removed.

By repeating the steps described above, multiple circuit patterns are formed on the wafer.

In accordance with the fabrication method of the present embodiment, high-integration devices, which were difficult to fabricate in the past, can be easily fabricated.

As described above, by using titanium oxide ($TiO_2$) films properly, the following advantages can be obtained.

(1) Dust and hazardous substances in the air can be prevented from adhering to, or from being deposited onto, the surfaces of optical elements (i.e., optical units) such as lenses, mirrors, and prisms, supporting units for supporting optical units, and barrels for containing optical units. Thus, optical properties do not decrease even after being used for long periods of time, and satisfactory conditions can be maintained. In particular, such an exposure apparatus is suitable for fabricating semiconductor devices, and a method for fabricating devices using the same can be achieved.

(2) A decrease in performance resulting from contamination of optical elements, optical systems, semiconductor fabricating apparatuses such as steppers, measuring instruments, and the like, which are applicable to ultraviolet light, in particular to far ultraviolet light, can be prevented. Consequently, apparatuses that require minimum maintenance can be obtained, resulting in improved productivity.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. An exposure apparatus comprising:

an illumination system for illuminating a pattern on a mask with luminous light from a light source;

a projection system for projecting the pattern onto a wafer; and an optical element, which has a titanium oxide film formed on only a periphery of its surface, wherein said optical element comprises a mirror.

2. An exposure apparatus according to claim 1, wherein a titanium oxide film is provided on the surface of at least one region of a supporting unit for supporting at least one optical unit.

3. An exposure apparatus according to claim 1, wherein said optical element comprises at least one of a lens, a mirror, a prism, a filter, a diffuser, a diffraction optical element, and an optical integrator.

4. An exposure apparatus according to claim 1, wherein said titanium oxide film is provided on the surface of a portion of a region of said optical element in which light passes through.

5. An exposure apparatus according to claim 1, wherein exposure is performed while the pattern on the mask and the wafer are synchronously scanned.

6. A device manufacturing method comprising:

an exposing step for exposing the wafer by using the exposure apparatus according to claim 1; and a developing step for developing the exposed wafer.

7. An exposure apparatus according to claim 1, wherein the optical element is included in the projection system.

8. An exposure apparatus comprising:

an illumination system for illuminating a pattern on a mask with luminous light from a light source;

a projection system for projecting the pattern onto a wafer; and an optical element, which has a titanium oxide film formed on only a periphery of its surface, wherein said optical element comprises at least one of a diaphragm, a shutter, and a lens barrel.

9. A device manufacturing method comprising:

an exposing step for exposing a wafer by using the exposure apparatus according to claim 8; and a developing step for developing the exposed wafer.

10. An exposure apparatus according to claim 8, wherein the optical element is included in the projection system.

* * * * *

UNITED STATES PATENT AND TRADEMARK OFFICE
CERTIFICATE OF CORRECTION

PATENT NO.    : 6,795,166 B2
DATED         : September 21, 2004
INVENTOR(S)   : Hideo Kato et al.

It is certified that error appears in the above-identified patent and that said Letters Patent is hereby corrected as shown below:

Title page,
Item [*] Notice, the following paragraph should be inserted:
-- This patent issued on a continued prosecution application filed under 37 CFR 1.53(d), and is subject to the twenty year patent term provisions of 35 U.S.C. 154(a)(2). --

Column 1,
Line 21 "to high integration" should read -- to the use of --.
Line 22, "ricating" should read -- ricating high-integration --.
Line 23, "used" should read -- used, --.
Line 26, "Substance" should read -- Substances --.

Column 2,
Line 6, "system;" should read -- system. --.
Line 13, "illuminated; and" should read -- illuminated. --.
Line 23, the right margin should be closed up.
Line 24, the left margin should be closed up.
Line 50, "apparatus;" should read -- apparatus. --.
Line 57, "substrate;" should read -- substrate. --.

Column 3,
Line 2, the right margin should be closed up.
Line 3, the left margin should be closed up.
Line 35, "aligner;" should read -- aligner. --.
Line 43, "wafer; and" should read -- wafer. --.
Line 55, the right margin should be closed up.

Signed and Sealed this

Eleventh Day of January, 2005

JON W. DUDAS
*Director of the United States Patent and Trademark Office*